(12) United States Patent
Pinter (10) Patent No.: US 8,550,639 B2
(45) Date of Patent: Oct. 8, 2013

(54) COVER DEVICE FOR A MICRO-OPTOMECHANICAL COMPONENT, AND MANUFACTURING METHOD FOR SUCH A COVER DEVICE

(75) Inventor: Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 152 days.

(21) Appl. No.: 13/297,908

(22) Filed: Nov. 16, 2011

(65) Prior Publication Data

US 2012/0140306 A1      Jun. 7, 2012

(30) Foreign Application Priority Data

Nov. 29, 2010   (DE) .......................... 10 2010 062 118

(51) Int. Cl.
  *G02B 23/16*   (2006.01)
  *H01L 23/02*   (2006.01)
(52) U.S. Cl.
  USPC ............................ 359/511; 257/680; 257/678
(58) Field of Classification Search
  CPC ...................................................... H01L 23/58
  USPC ................ 257/678, 680, 690, 729; 359/511, 359/512
  See application file for complete search history.

(56) References Cited

U.S. PATENT DOCUMENTS 6,314,117 B1 * 11/2001 Heim et al. ................. 372/43.01
6,700,138 B2 * 3/2004 Crane et al. ..................... 257/99
2007/0024549 A1  2/2007 Choi et al.

FOREIGN PATENT DOCUMENTS

EP           1688776           8/2006

\* cited by examiner

*Primary Examiner* — David N Spector
(74) *Attorney, Agent, or Firm* — Kenyon & Kenyon LLP (57) ABSTRACT

A cover device is described for a micro-optomechanical component having a substrate which has a maximum surface whose surface area is equal to or greater than a single surface area of any other surface of the substrate, and having at least one window, made of a light-transmitting material, which is inclined with respect to the maximum surface of the substrate, the at least one window being situated within at least one continuous opening provided in the substrate. A manufacturing method for a cover device for a micro-optomechanical component is also described. Furthermore, a micro-optomechanical component and a manufacturing method for a micro-optomechanical component are described.

15 Claims, 7 Drawing Sheets

COVER DEVICE FOR A MICRO-OPTOMECHANICAL COMPONENT, AND MANUFACTURING METHOD FOR SUCH A COVER DEVICE

CROSS-REFERENCE

The present application claims the benefit under 35 U.S.C. §119 of German Patent Application No. 102010062118.8 filed on Nov. 29, 2010, which is expressly incorporated herein by reference in its entirety.

FIELD OF THE INVENTION

The present invention relates to a cover device for a micro-optomechanical component. Moreover, the present invention relates to a manufacturing method for a cover device for a micro-optomechanical component. Furthermore, the present invention relates to a micro-optomechanical component and a manufacturing method for a micro-optomechanical component.

BACKGROUND INFORMATION

European Patent No. EP 1 688 776 A1 describes a housing for an optical scanner and a manufacturing method for manufacturing the housing. The housing has a glass cover which, with the aid of two support parts provided at different heights, is oriented at an angle to a surface of a base substrate having an adjustable mirror. The aim is to ensure that the reflections of a light beam which strikes the glass cover and which is to be directed onto the adjustable mirror do not strike an impact surface of the light beam which is deflected by the adjustable mirror. At least one antireflective layer may be provided on a boundary surface of the glass cover.

In addition, U.S. Patent Application Publication No. 2007/0024549 A1 describes a housing of a micromirror device having a window lid which is mounted on a base substrate and which covers a micromirror situated on the base substrate. The window lid includes a light-transmitting part, made of the window lid material, through which a laser beam is to be directed onto the micromirror, at least the outer surface of the light-transmitting part being inclined with respect to the micromirror.

SUMMARY

The present invention provides a cover device for a micro-optomechanical component, and a manufacturing method for a micro-optomechanical component. In accordance with the present invention, the window is protected from damage such as scratching, for example, and deposition of particles by providing the at least one (optical) window inside the at least one continuous opening. This advantage is ensured after providing the at least one window in the continuous opening during the further processing. The at least one window may thus be prevented from being damaged or soiled during a subsequent process, when sold or transported, or during use of the cover device or the micro-optomechanical component.

As a result of the inclined orientation of the at least one window with respect to the maximum surface of the substrate, the cover device may be easily fastened to a function carrier of a micro-optomechanical component having an optically active component in such a way that the at least one window is inclined with respect to a nonadjustable optically active component or to an adjustable optically active component in its neutral position, i.e., inclined with respect to the optically active surface thereof. Reflections of a light beam which is directed through the at least one window may thus be easily prevented from striking a target impact surface onto which the light beam is directed. Reflections which often typically result at the window boundary surfaces when an optical beam passes through a conventional transparent window and strike the target impact surface, and which are often considered to be objectionable during imaging, may thus be prevented. In particular when the stationary reflections are present in the scanning region of a micromirror which is designed as an optically active surface, which is typically often the case, the intensity of the reflections frequently exceeds that of the projected image, which may thus significantly impair the projected image. These interfering reflections may be reduced only with regard to their intensity by an antireflective coating of the light window which is often used according to the related art; however, with the aid of the present invention, the appearance of such a reflection in an image to be projected may be reliably prevented.

Above, an advantage of the present invention is described with reference to a micro-optomechanical component which is designed as a scanning device and which has a cover device according to the present invention, in which a micromirror is deflected from its neutral position, for example in order to oscillate symmetrically about its neutral position. However, the above-described advantage of the present invention is not limited to this application example.

The cover device according to the present invention may be easily mounted on/fastened to a function carrier for covering an optically active component situated on the function carrier. This reliably ensures protection of the optically active component from harmful external environmental influences such as humidity or an aggressive medium that is present in the external surroundings of the cover device and the function carrier, for example. Protection of the optically active component from mechanical contact/destruction is also ensured.

In particular, after providing multiple cover devices in the wafer composite on multiple function carriers which are present in the wafer composite, a chip composed of a single cover device and a single function carrier may be separated, for example sawed out, without concern for damaging the optically active component. In addition, a preferred atmosphere, such as an advantageous type of gas, or a certain pressure value (a vacuum, for example), in the immediate vicinity of the optically active component may be easily established by hermetically encapsulating the optically active component with the aid of the cover device. The optically active component, with which the cover device is able to cooperate, may include a filter, a beam splitter, a static mirror, a mirror which is movable about at least one rotational axis, a grid, and/or a CCD detector, for example. However, the optically active component is not limited to the exemplary embodiments listed herein.

The example manufacturing method according to the present invention may be carried out in a cost-effective manner. In addition, the example manufacturing method is suitable for series production. In contrast to the related art described above, when carrying out the manufacturing method, it is not necessary to orient a glass cover, designed as a cover device, at an angle with respect to a carrier substrate. Thus, it is not necessary to provide the glass cover with support parts having different heights, and to take into account increased storage space requirements and/or a higher risk of damage to the inclined glass cover. In addition, when carrying out the example manufacturing method according to the present invention it is not necessary to form three-dimensional surface structures on a cover device which is designed as a window lid, which is very expensive and/or which barely ensures the required optical quality. In addition, a wafer having such a three-dimensional surface structure may be easily damaged during processing. In contrast, the present invention may allow for a cost-effective manufacturing method which is suitable for large series production.

BRIEF DESCRIPTION OF THE DRAWINGS

Further features and advantages of the present invention are explained below with reference to the figures.

DETAILED DESCRIPTION OF EXAMPLE EMBODIMENTS

Figure 1:
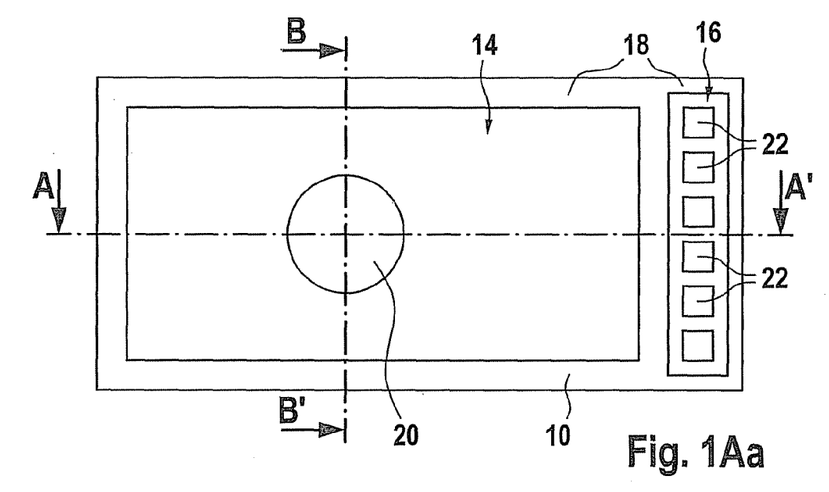
FIGS. 1A through 1D show schematic illustrations of a substrate for explaining one specific embodiment of the manufacturing method, top views of the substrate being shown in FIGS. 1Aa through 1Da, cross sections of the substrate along a first axis being shown in FIGS. 1Ab through 1Db, and cross sections of the substrate along a second axis which is perpendicular to the first axis being shown in FIGS. 1Ac through 1Dc.

FIGS. 1A through 1D show schematic illustrations of a substrate for explaining one specific embodiment of the manufacturing method, top views of the substrate being shown in FIGS. 1Aa through 1Da, cross sections of the substrate along a first axis being shown in FIGS. 1Ab through 1Db, and cross sections of the substrate along a second axis which is perpendicular to the first axis being shown in FIGS. 1Ac through 1Dc.

FIG. 1Aa shows a top view of a substrate 10. FIG. 1Aa illustrates the region of substrate 10 which is usable, for example, as a cover device of a single micro-optomechanical component, in particular a single chip, after carrying out the method steps described below. However, it is pointed out that the practicability of the method steps described below is not limited to (separate) manufacture of a cover device which is usable only for a micro-optomechanical component. Rather, the described method steps are also suitable for large series production, and may therefore be carried out on a wafer, for example a cap wafer, for the joint manufacture of multiple cover devices for simultaneous capping of multiple micro-optomechanical components. Thus, a wafer on which the components described below are formable in a plurality may also be used as a substrate 10. Strictly for the sake of greater clarity, the method steps on substrate 10 described below are illustrated for the covering of only one micro-optomechanical component.

Substrate 10 may include a semiconductor material such as silicon, for example. In particular, substrate 10 may be composed completely of a semiconductor material, in particular silicon. However, instead of a substrate 10 made of a semiconductor material, i.e., a semiconductor wafer, a substrate 10 made of some other material, for example a metal or a plastic, or a substrate 10 which includes at least one semiconductor material, a metal and/or a plastic, may be used for the method steps described below.

FIG. 1Ab shows a cross section of substrate 10 along an axis A-A'. A further cross section of substrate 10 along an axis B-B' which is perpendicular to axis A-A' is illustrated in FIG. 1Ac. The area covered by the two axes A-A' and B-B' corresponds to the surface area of substrate 10.

At least one depression 14 and 16 may be formed in a first side of substrate 10, which is referred to below as inner side 12 of substrate 10. In this method step, the at least one depression 14 and 16 is preferably not formed as a continuous opening through substrate 10. The at least one depression 14 and 16 may be formed, for example, via an etching step, such as KOH etching, or trenching. As an alternative to an etching step, a (mechanical) material removal process, for example a sandblasting process, a mechanical drilling process, and/or a grinding process, may be carried out for forming the at least one depression 14 and 16. Likewise, the at least one depression 14 and 16 may be formed on inner side 12 with the aid of a laser. However, the method described herein is not limited to forming at least one depression 14 or 16 in the first side of the substrate.

With the aid of the at least one depression 14 and 16, at least one fastening part 18 which protrudes at inner side 12 may be formed as a subunit of the subsequent cover device. With the aid of the at least one fastening part 18, the subsequent cover device may be mounted on/fastened to a comparatively small fastening area of a function carrier (not illustrated) of a micro-optomechanical component. In particular, the at least one fastening part 18 may be designed in such a way that it surrounds the at least one depression 14 and 16. At least one free space may thus be formed at inner side 12 of substrate 10/the subsequent cover device, into which at least one component of the function carrier subsequently mounted thereon may protrude. A micromirror 20 and bond pads 22 are illustrated as examples of such a component of the function carrier. However, micromirror 20 and bond pads 22 are only possible examples of suitable components of the function carrier which is mountable on the subsequent cover device. For example, instead of or in addition to micromirror 20, the function carrier may have a differently designed, optically active component, such as a filter, a beam splitter, a CCD detector, and/or a grid, for example. Instead of or in addition to bond pads 22, the function carrier may have a differently designed electrical contact.

Micromirror 20, bond pads 22, the other optically active component, and/or the differently designed electrical contact preferably do not directly contact substrate 10/the subsequent cover device. In this case, micromirror 20, bond pads 22, the other optically active component, and/or the differently designed electrical contact are not part of the subsequent cover device itself, i.e., do not contact same. Instead, mirror 20, bond pads 22, the other optically active component, and/or the differently designed electrical contact may (directly) contact the function carrier which is subsequently mounted on the completed cover device. The illustration of micromirror 20 and bond pads 22 in the figures described below serves only to illustrate one advantageous position and dimensioning of the structures provided on substrate 10, and for better understanding of the method steps described below.

After the at least one depression 14 and 16 is formed, the substrate has a maximum surface 24 which preferably is smooth, and whose surface area is equal to or greater than a single surface area of any other surface of substrate 10. In the exemplary embodiment illustrated, maximum surface 24 corresponds to an outer side 26 of substrate 10 facing away from inner side 12 (smooth design). However, the method described herein is not limited to a smooth design of outer side 26. Rather, maximum surface 24 may also be a subregion of outer side 26, or a base surface of the at least one depression 14 and 16.

FIGS. 1Ba through 1Bc show substrate 10 after at least one continuous opening 28 and 30 through substrate 10 has been formed. At least one continuous opening 28 is formed as an optical access for an optically active component, for example micromirror 20. Additionally, at least one further continuous opening 30 may be provided for contacting the optionally present electrical contact of the subsequent function carrier, for example for contacting bond pads 22. The flat surface area of the at least one continuous opening 28 for the optical access, parallel to maximum surface 24, preferably corresponds to an optically active surface of the optically active component, for example a mirror surface of micromirror 20. For example, at least one etching step may be carried out to form the at least one continuous opening 28 and 30.

In a further method step, the at least one continuous opening 28 for the optical access may be expanded at one side in such a way that the continuous opening has a narrowing 32 which protrudes into continuous opening 28 between outer side 26 and inner side 12. An etching step may be carried out for this purpose. One possible result of the etching step is shown in FIGS. 1Ca through 1Cc, the expansion of the at least one continuous opening 28 for the optical access being provided at outer side 26. This is advantageous for subsequently providing the at least one continuous opening 28 for the optical access from outer side 26. However, it is pointed out that the expansion may also be provided at inner side 12 for subsequently providing the at least one continuous opening 28 for the optical access from the inner side.

In both cases, narrowing 32 may be designed as a window seat 34 which protrudes into the at least one continuous opening 28 for the optical access. Window seat 34 has at least one fastening surface 36 which is oriented toward the side for the fitting (outer side 26 in the illustration). Each of continuous openings 28 for the optical access at the side for the fitting is preferably expanded in such a way that an interface 35 extending perpendicularly to the side for the fitting is definable which divides expanded continuous opening 28 into two parts, continuous opening 28 in a first expansion region 38a being etched more quickly and/or more deeply in a first part of the two parts than in another, second expansion region 38b in another, second part of the two parts. The method step which is carried out may also be described such that in the at least one continuous opening 28 for the optical access, an indentation having an end face that is inclined with respect to maximum surface 24 is formed as a fastening surface 36 for a window seat 34.

The expansion process used is preferably carried out in such a way that the at least one window seat 34 which is formed protrudes annularly into associated continuous opening 28. As a result of the unequal etching in expansion regions 38a and 38b, fastening surface 36 of the at least one annularly formed window seat 34 is inclined with respect to maximum surface 24. Fastening surface 36 of the at least one annularly formed window seat 34 is therefore nonparallel and nonperpendicular to maximum surface 24.

Even for a design of window seat 34 which is not annular, the window seat may have multiple mutually separated sections having multiple fastening surfaces 36 which, due to the above-described expansion having different depths, are situated in a plane which is inclined with respect to, i.e., nonparallel and nonperpendicular to, maximum surface 24.

In a further method step, at least one (optical) window 40 within the at least one continuous opening 28 for the optical access is inclined with respect to maximum surface 34 of substrate 10 (fitting). Thus, an angle of inclination a between 0° and 90° is present between a middle surface 41 of each window 40, which extends along the surface area of window 40, and maximum surface 34 of substrate 10. Window surfaces 44a and 44b of each window 40 may also be inclined with respect to maximum surface 34 of substrate 10 by angle of inclination α between 0° and 90°.

The at least one window 40 is preferably fastened to a window seat 34 in each case, in particular on at least one fastening surface 36 thereof. It is thus ensured that, after the at least one window 40 is mounted on a window seat 34 in each case, the at least one window 40 is inclined with respect to maximum surface 34 of substrate 10 without additional effort. Instead of mounting the at least one window 40 on a window seat 34 in each case, an edge of the at least one window 40 situated between the two window surfaces 44a and 44b may contact a side wall of continuous opening 28.

The at least one window 40 is advantageously made of a light-transmitting material having an index of refraction which is not equal to the index of refraction of air. The outer contour of the at least one window 40 is preferably a triangle, a quadrilateral, or a hexagon. Advantageous shapes of the at least one window 40 are described in greater detail below.

The at least one window 40 is preferably hermetically connected to substrate 10. This may be ensured by providing the at least one window 40 with a suitable joining material 42 before insertion into the at least one continuous opening 28 for the optical access, preferably before separating the at least one window 40 from a plate of a light-transmitting material. A glass solder or an adhesive may be used as joining material 42. The joining material may be applied annularly to ensure a hermetic connection of the at least one window 40 to substrate 10. In particular, joining material 42 may be deposited as a bead of glass solder or adhesive on the at least one window 40. Optionally, joining material 42 is melted on or pre-cured before window 40 is inserted into the at least one continuous opening 28, in particular before the at least one window 40 is separated from the plate made of light-transmitting material.

Advantageous method steps for providing the at least one continuous opening 28 for the optical access with the at least one window 40 are described in greater detail below. FIGS. 1Da through 1Dc show substrate 10 after window 40 has been provided.

The mounting of the at least one window 40 in the at least one continuous opening 28 for the optical access may also be described such that window 40 is situated in an opening volume of associated opening 28 which is delimited by a definable first plane of a first edge region 46a of a side wall of associated opening 28 at an end facing outer side 24, and a definable second plane of a second edge region 46b of the side wall of associated opening 28 at an end facing inner side 12. It is thus ensured that the at least one window 40 which is countersunk in substrate 10 is also protected from damage, in particular scratching, and/or from soiling in all subsequent handling and process steps.

In a further method step which is not described, substrate 10 which is completed as a cover device may be connected to at least one function carrier for at least one micro-optomechanical component. Standard connecting processes in micromechanics, which may also be referred to as bonding processes, may be used therefor. For example, bonding using glass solder or adhesive, eutectic bonding, and/or anodic bonding may be employed as bonding processes. Thus, the cover device may be fastened to the function carrier with little effort, using a cost-effective method step.

In particular, a wafer composed of multiple completed cover devices/substrates 10 having multiple (optical) windows 40, depressions 14 and 16, and continuous openings 28 and 30, which may be referred to as a cap wafer, may be joined to a wafer composed of function carriers which include multiple optically active components (MEMS or MOEMS wafer) in the wafer composite. For this purpose, the cap wafer is aligned with the function wafer and joined thereto. During the alignment, the individual wafers may be oriented with respect to one another in such a way that a light beam passing through a window 40 strikes an associated optical component, and/or a light beam directed away from an optical component passes through an associated window. Similarly, the contact parts of the function carrier may also be suitably aligned with continuous openings 30 for the electrical contacting, for example for connecting thin wires. This alignment may be carried out using inexpensive systems/aligners. The subsequent joining may be carried out using at least one of the bonding processes listed above. One particular advantage of using anodic bonding is that the connection between a glass material and a silicon material is free of joining material. A wafer bonding method step may also be used in which the cap wafer and a wafer having function carriers are pressed together using high mechanical pressure, since the at least one window 40 is reliably protected from pressure damage due to its countersunk configuration.

Multiple chips may be separated from the joined wafers using only one sawing step. For glass-silicon composite wafers, it is usually necessary to initially saw the glass in a first sawing step with low feed and high breakout rates, while after the wafer composite is laminated in a second sawing step with high feed and low breakout rates, the silicon is sawed using a different saw blade. Thus, the separation in a single sawing step without lamination, with high feed and low breakout rates, which may be carried out for the joined wafers having substrate 10 using the technology according to the present invention, means a significant cost savings compared to conventional glass-silicon cap wafers. In addition, additional chip surface area is ensured due to narrower sawing lines.

The sequence of method steps described in the preceding paragraphs is stated only as an example. It is pointed out that a departure from this sequence is also possible.

Exemplary embodiments for the cover device and a micro-optomechanical component having a function carrier which has an optically active component mounted thereon and a cover device mounted on the function carrier are explained with reference to the above-described method steps and FIGS. 1Da through 1Dc. Therefore, additional description of a specific embodiment of the cover device or of the micro-optomechanical component thus equipped is dispensed with here.

Figure 2A:
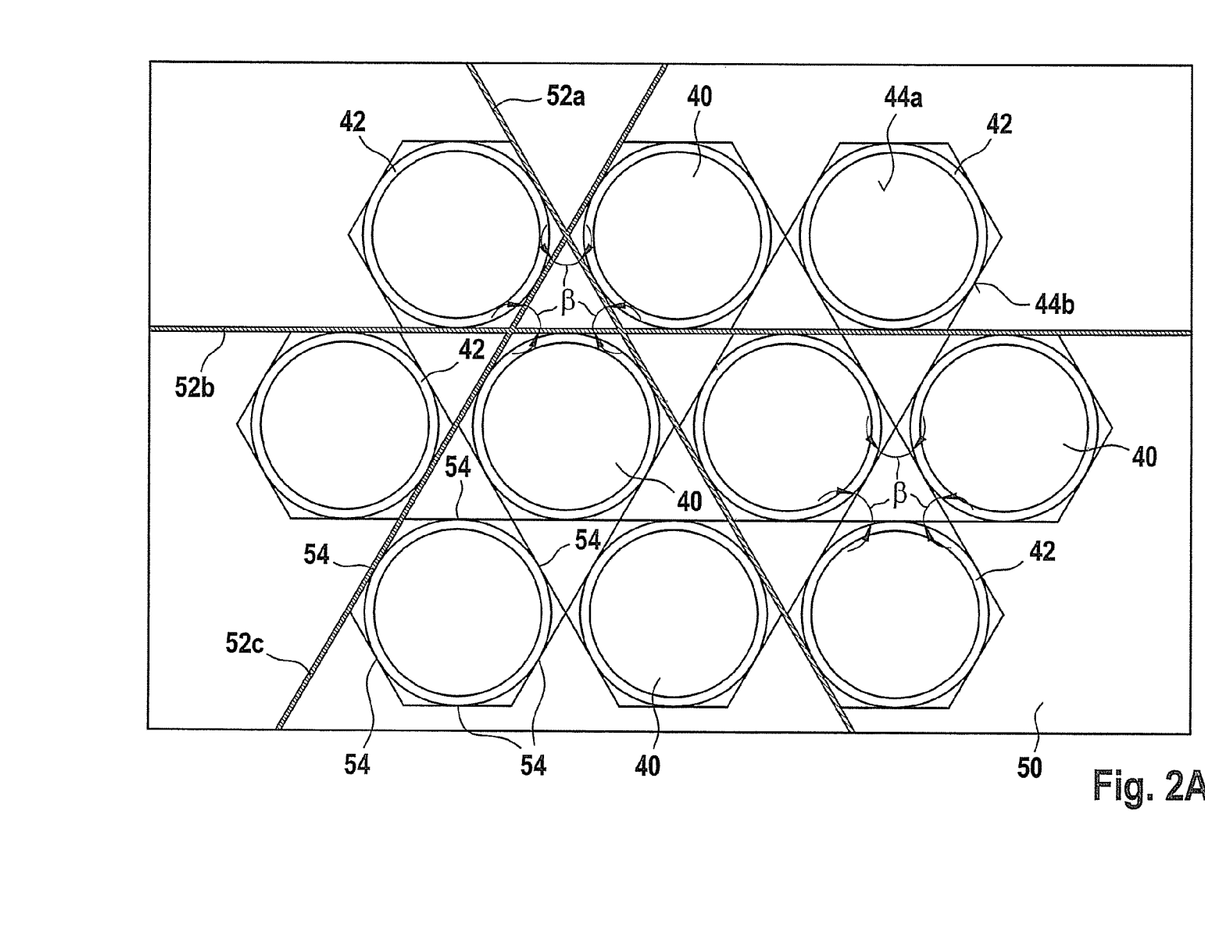
FIGS. 2A and 2B show schematic top views of a plate made of a light-transmitting material for explaining two exemplary embodiments for producing a window for the manufacturing method.
Figure 2B:
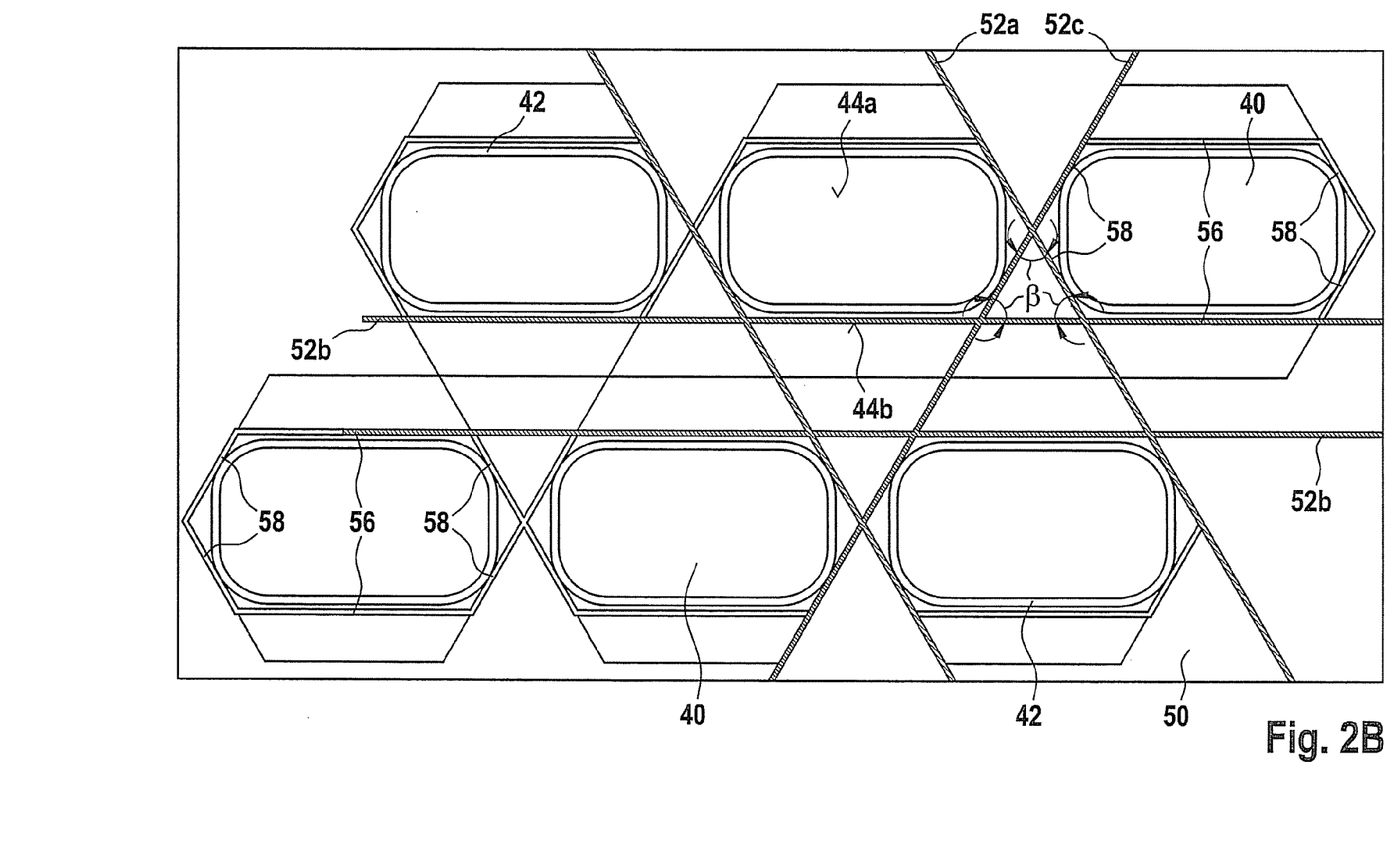

FIGS. 2A and 2B show schematic top views of a plate made of a light-transmitting material for explaining two exemplary embodiments for producing a window for the manufacturing method.

In both specific embodiments, multiple windows 40 are separated from a plate 50 made of a light-transmitting (transparent) material having an index of refraction which is not equal to the index of refraction of air, such as glass or plastic, for example. A thin, flat glass wafer may also be used as plate 50, for example. Such a plate 50 preferably has at least one surface of high optical quality.

Optionally, before the separation at least one surface of plate 50 may be provided with at least one optical layer, for example an antireflective layer. Before plate 50 is separated, a joining material 42, for example a glass solder or an adhesive, may also be applied to the surfaces of subsequent windows 40. A screen printing process may be used to apply the suitable joining material 42. Joining material 42 may in particular be applied annularly, such as in a bead of glass solder or adhesive. Optionally, the joining material is subsequently melted on or pre-cured.

For the separation, (optical) windows 40 may be sawed from plate 50. Thus, the cost-effective wafer sawing process which is customary in the semiconductor industry may be used. Windows 40 may be designed with a hexagonal contour so that they have two hexagonal window surfaces 44a and 44b. In this case, a good yield of windows 40 is ensured, as well as an edge which has a large surface area, compared to the individual surface areas of window surfaces 44a and 44b, for applying joining material 42. The hexagonal contour may be easily formed by sawing plate 50 along three mutually inclined sawing lines 52a, 52b, and 52c. Each of the three sawing lines 52a, 52b, and 52c is preferably inclined with respect to the other two respective sawing lines 52a, 52b, and 52c by a sawing angle β of 60°.

In the example in FIG. 2A, window surfaces 44a and 44b are designed as equiangular hexagons. Outer edges 54 of window surfaces 44a and 44b thus have the same length. This ensures in particular that material is conserved when window 40 is sawed out.

In addition, the shape of window surfaces 44a and 44b may be formed in such a way that two oppositely situated outer edges 56 are longer than the other four equal-length outer edges 58 of window surfaces 44a and 44b (see FIG. 2B). In this case, a large inclination of window 40 which is mounted on the substrate may be achieved, even when the window seat has a small thickness, as a result of the "extension" of the window along longer outer edges 56.

Figure 3:
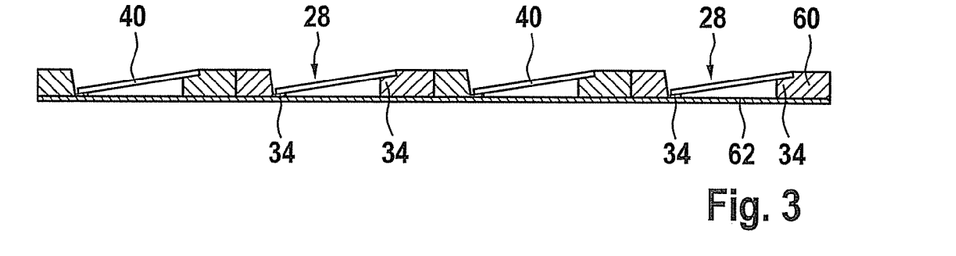
FIG. 3 shows a schematic illustration of a first exemplary embodiment for providing a wafer with windows for the manufacturing method.

FIG. 3 shows a schematic illustration of a first exemplary embodiment for providing a wafer with windows for the manufacturing method.

Windows 40 may be introduced one after the other in each continuous opening 28 of a wafer 60, for example using a pick-and-place process. This may be carried out without concern for scratching windows 40. The window surface is preferably aligned with the fastening surface of window seat 34, using the joining material (not illustrated), during introduction of each window 40 into associated continuous opening 28. In addition, windows 40 and wafer 60 may be mechanically fixed beneath wafer 60 using a suction plate 62 which is provided with suction openings (not illustrated). During the suctioning, wafer 60 may be heated in such a way that the joining material softens and wets both joining partners. The suctioning of windows 40 which is carried out in conjunction with the softening of the joining material causes deformation/squeezing of the joining material, so that both joining partners are reliably wetted by the joining material. The joining means subsequently hardens upon cooling.

Figure 4A:
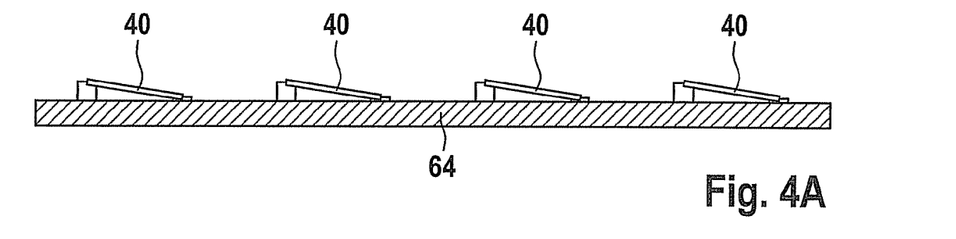
FIGS. 4A and 4B show a schematic illustration of a second exemplary embodiment for providing a wafer with windows for the manufacturing method.
Figure 4B:
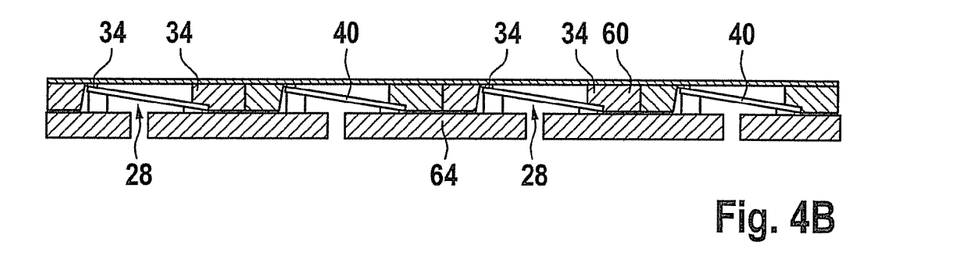

FIGS. 4A and 4B show a schematic illustration of a second exemplary embodiment for providing a wafer with windows for the manufacturing method.

The at least one window 40 is placed on a workpiece holder 64 in a prior method step (see FIG. 4A). The at least one window 40 is not damaged. The workpiece holder 64 which is used preferably has a surface structure that corresponds to window seat 34 and the desired inclination of the at least one window 40. However, windows 40 may also protrude from the plane of workpiece holder 64.

After workpiece holder 64 has been provided with the at least one window 40, wafer 60 may be mounted on/aligned with workpiece holder 64 in such a way that the side for filling the at least one continuous opening 28, i.e., each fastening surface of a window seat of wafer 60, is oriented toward workpiece holder 64. Commercially available systems such as an aligner, for example, may be used for aligning workpiece holder 64 and wafer 60. Windows 40 may subsequently be bonded to wafer 60 at an elevated temperature and/or a mechanical contact pressure in a commercially available system for wafer bonding. In the bonding process illustrated in FIG. 4B, the apparatus and design ensure that the window surfaces of the at least one window 40 are not damaged.

What is claimed is:

1. A cover device for a micro-optomechanical component, comprising:
    a substrate which has a maximum surface whose surface area is equal to or greater than a single surface area of any other surface of the substrate; and
    at least one window made of a light-transmitting material, which is inclined with respect to the maximum surface of the substrate and which is situated within at least one continuous opening provided in the substrate.

2. The cover device as recited in claim 1, wherein the at least one window is situated in at least one opening volume of an associated continuous opening which is delimited by a definable first plane of a first edge region of a side wall of the associated continuous opening at an end facing a first side of the substrate, and a definable second plane of a second edge region of the side wall of the associated continuous opening at an end facing a second side of the substrate.

3. The cover device as recited in claim 1, wherein the at least one window is hermetically connected to the substrate.

4. The cover device as recited in claim 1, wherein the cover device has at least one fastening part which surrounds at least one depression formed in the substrate.

5. The cover device as recited in claim 1, wherein the at least one window is provided in each case on a window seat which protrudes into the at least one continuous opening.

6. The cover device as recited in claim 5, wherein the at least one window is situated in each case on at least one fastening surface of the associated window seat, which is inclined with respect to the maximum surface of the substrate.

7. The cover device as recited in claim 1, wherein the at least one window has one of two triangular, quadrilateral, or hexagonal window surfaces.

8. The cover device as recited in claim 7, wherein the at least one window has two hexagonal window surfaces and two oppositely situated outer edges which are longer than another four equal-length outer edges of the window surfaces.

9. A micro-optomechanical component, having a function carrier which has an optically active component mounted thereon, the micro-optical component having a cover device mounted on the function carrier, the cover device comprising a substrate which has a maximum surface whose surface area is equal to or greater than a single surface area of any other surface of the substrate; and at least one window made of a light-transmitting material, which is inclined with respect to the maximum surface of the substrate and which is situated within at least one continuous opening provided in the substrate.

10. A method for manufacturing a cover device for a micro-optomechanical component, comprising:
    providing at least one window made of a light-transmitting material on a substrate, the substrate having a maximum surface whose surface area is equal to or greater than a single surface area of any other surface of the substrate, the at least one window being inclined with respect to the maximum surface of the substrate, and the at least one window being situated within at least one continuous opening provided in the substrate.

11. The method as recited in claim 10, wherein the at least one window is at least partially coated with a joining material is suctioned for fastening to the substrate with simultaneous heating of the substrate.

12. The method as recited in claim 10, wherein the at least one window is placed on a workpiece holder, and the substrate is subsequently mounted on the workpiece holder.

13. The method as recited in claim 10, wherein before providing the at least one window within the associated continuous opening, at least one window seat which protrudes into the associated continuous opening and which has at least one fastening surface that is inclined with respect to the maximum surface is formed, and the at least one window is situated at the at least one fastening surface.

14. The method as recited in claim 13, wherein the at least one window seat is formed by expanding the at least one continuous opening, and during the expansion of the at least one continuous opening a first expansion region is etched at least one of more quickly and more deeply, than a second expansion region.

15. A method for manufacturing a micro-optomechanical component, comprising:
    producing a cover device including providing at least one window made of a light-transmitting material on a substrate, the substrate having a maximum surface whose surface area is equal to or greater than a single surface area of any other surface of the substrate, the at least one window being inclined with respect to the maximum surface of the substrate, and the at least one window being situated within at least one continuous opening provided in the substrate; and
    mounting the cover device on a function carrier having an optically active component mounted thereon.

* * * * *